(12) United States Patent
Moll et al.

(10) Patent No.: US 9,553,030 B2
(45) Date of Patent: Jan. 24, 2017

(54) METHOD OF MANUFACTURING P-CHANNEL FET DEVICE WITH SIGE CHANNEL

(71) Applicant: GLOBALFOUNDRIES Inc., Grand Cayman (KY)

(72) Inventors: Hans-Peter Moll, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 14/695,232

(22) Filed: Apr. 24, 2015

(65) Prior Publication Data
US 2016/0315016 A1 Oct. 27, 2016

(51) Int. Cl.
| | |
|---|---|
| H01L 21/84 | (2006.01) |
| H01L 21/762 | (2006.01) |
| H01L 21/02 | (2006.01) |
| H01L 29/66 | (2006.01) |
| H01L 29/78 | (2006.01) |
| H01L 21/8238 | (2006.01) |
| H01L 29/786 | (2006.01) |

(52) U.S. Cl.
CPC ....... *H01L 21/823807* (2013.01); *H01L 21/84* (2013.01); *H01L 21/02532* (2013.01); *H01L 21/76264* (2013.01); *H01L 21/845* (2013.01); *H01L 29/6656* (2013.01); *H01L 29/66545* (2013.01); *H01L 29/78* (2013.01); *H01L 29/78648* (2013.01)

(58) Field of Classification Search
CPC ............. H01L 21/84; H01L 27/1203; H01L 21/823807; H01L 29/78648; H01L 29/66545; H01L 29/6656; H01L 29/78; H01L 29/7848; H01L 21/02532; H01L 21/76264; H01L 21/845
USPC ....................................... 438/154
See application file for complete search history.

(56) References Cited

U.S. PATENT DOCUMENTS

2006/0228851 A1* 10/2006 Sadaka ............... H01L 29/1054
438/221

* cited by examiner

*Primary Examiner* — Caleen Sullivan
(74) *Attorney, Agent, or Firm* — Amerson Law Firm, PLLC

(57) ABSTRACT

A method of forming a semiconductor device is provided including providing a semiconductor-on-insulator (SOI) wafer comprising a first semiconductor layer comprising a first material component and formed on a buried oxide (BOX) layer, and forming a channel region of a P-channel transistor device, including forming a second semiconductor layer only over a first portion of the first semiconductor layer, wherein the second semiconductor layer comprises the first material component and a second material component different from the first material component, forming an opening in the first semiconductor layer outside the first portion and subsequently performing a thermal anneal to push the second material component from the second semiconductor layer into the first semiconductor layer.

19 Claims, 11 Drawing Sheets

METHOD OF MANUFACTURING P-CHANNEL FET DEVICE WITH SIGE CHANNEL

BACKGROUND OF THE INVENTION

1. Field of the Invention

Generally, the subject matter disclosed herein relates to the field of integrated circuits, and, more particularly, to a method of manufacturing P-channel transistor devices. More particularly, the subject matter disclosed herein relates to improved methods of forming P-channel transistor devices with channels comprising silicon-germanium materials.

2. Description of the Related Art

Integrated circuits formed on semiconductor wafers typically include a large number of circuit elements, which form an electric circuit. In addition to active devices such as, for example, field effect transistors and/or bipolar transistors, integrated circuits can include passive devices such as resistors, inductors and/or capacitors. In particular, during the fabrication of complex integrated circuits using CMOS technology, millions of transistors, i.e., N-channel transistors and P-channel transistors, are formed on a substrate including a crystalline semiconductor layer.

A MOS transistor, for example, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer.

The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may be adapted to the reduced channel length in order to maintain the required channel controllability. However, some mechanisms for obtaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the process adaptations associated with device scaling.

Moreover, current technologies providing more compact and functional electronic devices require semiconductor devices with exactly adjusted threshold voltages at differ threshold voltage levels. Conventionally, some measures for tuning the threshold voltage involve performing implantation processes which are adapted for each semiconductor device type individually for appropriately setting the required threshold voltage to a desired value. For example, halo implantation processes are conventionally performed for adjusting the threshold voltage when fabricating modern semiconductor devices, such as MOS transistors, with short channels, e.g., less than 50 nm channel length. Herein, the accordingly formed halo regions encompass source and drain extension regions of each transistor towards the channel. Basically, halo regions are regions doped with dopants of similar conductivity type as those that are present in the surrounding active region, therefore representing counter-doped regions with regard to the source and drain doping. However, the dopant concentration in halo regions is higher as compared to the surrounding active regions. At present, halo regions represent conventional measures employed for reducing so-called short channel effects which appear at small gate lengths scales and short channel lengths scales, respectively. It is apparent that, with devices of various device types or flavors possibly being formed in different regions across a single semiconductor wafer, individual tuning in each region becomes necessary in order to minimize unwanted variations. The result is a complex process flow, even posing the risk of introducing unacceptably high variations of the threshold voltage across the wafer due to the inclusion of new processes.

With respect to improved control of the threshold voltages and enhanced channel conductivities, i.e., carrier mobility, PMOS SOI devices have been introduced that comprise strained silicon germanium channels (cSiGe).

FIGS. 1a and 1b show an example of the conventional CMOS FDSOI manufacturing of a semiconductor device by integrating strained SiGe channel PFET and silicon channel NFET devices. As shown in FIG. 1a, on an SOI wafer comprising a substrate 1, a thin buried oxide layer 2 and a silicon layer 3, an NFU area and a PFET area are defined. An SiGe layer 4 is epitaxially formed on a portion of the silicon layer 3 of the PFET region. After thermal oxidation enhanced condensation, the SiGe/silicon bi-layer is converted into a single SiGe layer 4' as shown in FIG. 1b. Typically, the single SiGe layer 4' has a thickness in a range from about 8-12 nm. The thin buried oxide layer 2 of the SOI wafer may have a comparable thickness of about 10-25 nm. After completion of the condensation process performed to obtain the single SiGe layer 4', an isolation structure 5, for example, a shallow trench isolation (STI), is formed in order to electrically isolate the NFET area from the PFET area.

However, in the art, the problem arises that, during the condensation process, the thin SiGe layer 4' that is not sufficiently stabilized by the thin buried oxide layer 2 starts warping. The resulting deformation of the SiGe layer 4' negatively affects the reliability and performance of the resulting PFETs.

Therefore, the present invention provides techniques for manufacturing PFET devices comprising SiGe channels wherein the above-described problems are efficiently mitigated.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

A method of forming a semiconductor device is provided including providing a semiconductor-on-insulator (SOI) wafer comprising a first semiconductor layer comprising a first material component (for example, silicon) and formed on a buried oxide (BOX) layer and forming a channel region of a P-channel transistor device. Forming a channel region of a P-channel transistor device includes forming a second semiconductor layer only over a first portion of the first semiconductor layer, wherein the second semiconductor layer comprises the first material component and a second material component (for example, silicon-germanium) different from the first material component, forming an opening in the first semiconductor layer outside the first portion and subsequently performing a thermal anneal to push the second material component from the second semiconductor layer into the first semiconductor layer.

Moreover, a method of forming a semiconductor device is provided including forming an N-channel transistor device on a first region of a silicon-on-insulator (SOI) wafer that comprises a buried oxide (BOX) layer on a substrate and a first semiconductor layer on the BOX layer and forming a P-channel transistor device on a second region of the SOI wafer that is different from the first region. The first semiconductor layer comprises a first material component (for example, silicon). Forming the P-channel transistor device includes forming a second semiconductor layer that comprises the first material component and a second material component (for example, silicon-germanium) different from the first one on the first semiconductor layer in the second region without forming it in the first region, forming an opening in the first semiconductor layer adjacent to the second semiconductor layer and subsequently performing a thermal anneal to push the second material component from the second semiconductor layer into the first semiconductor layer.

In both examples, the thermal anneal treatment may result in an oxide enhanced condensation process. Based on the exemplary methods, a PFET with cSiGe can be formed, for example.

BRIEF DESCRIPTION OF THE DRAWINGS

The disclosure may be understood by reference to the following description taken in conjunction with the accompanying drawings, in which like reference numerals identify like elements, and in which.

Figure 1A:
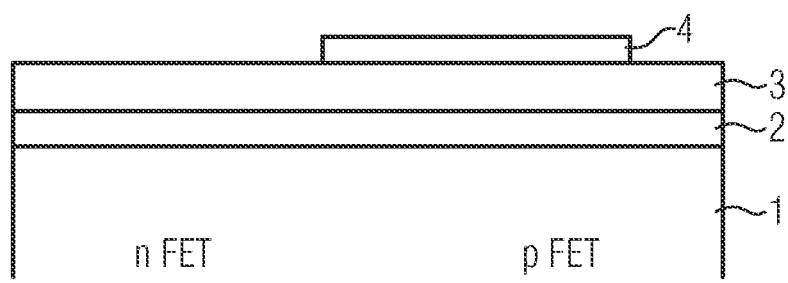
FIGS. 1a and 1b illustrate the manufacturing of a PFET comprising an SiGe channel according to an example of the art.
Figure 1B:
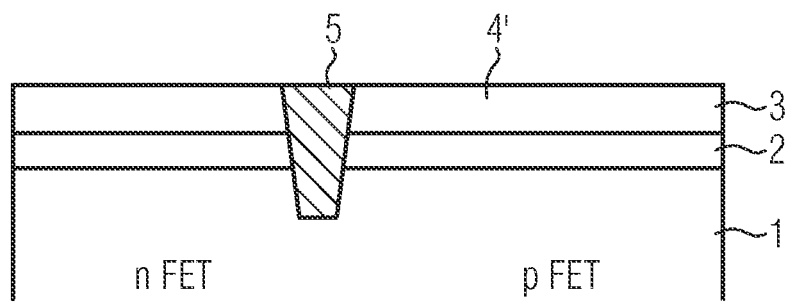

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques for semiconductor devices in which N-channel transistors and/or P-channel transistors are formed are described herein. The manufacturing techniques may be integrated in CMOS manufacturing processes. The techniques and technologies described herein may be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Figure 2A:
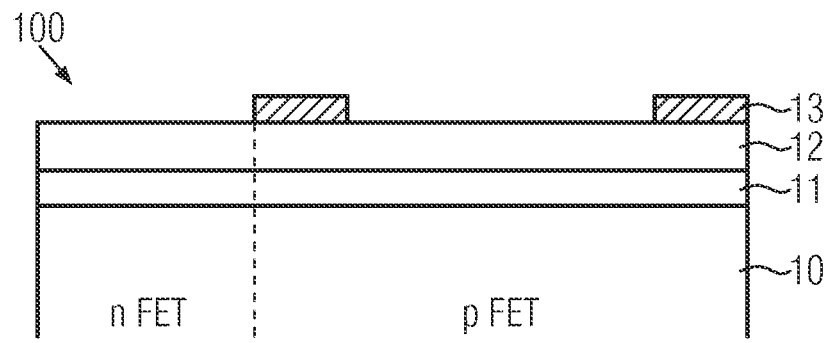
FIGS. 2a-2e illustrate the manufacturing of a semiconductor device comprising a PFET with cSiGe according to an example of the present invention.

In the following, a process flow for manufacturing a semiconductor device 100 according to an example of the present disclosure is described with reference to FIGS. 2a-2e. As shown in FIG. 2a, a substrate 10 is provided. The substrate 10 may be a semiconductor substrate. The semiconductor substrate may be a silicon substrate, in particular, a single crystal silicon substrate. Other materials may be used to form the semiconductor substrate such as, for example, germanium, silicon germanium, gallium phosphate, gallium arsenide, etc. An insulating layer 11 is formed on the substrate 10. The insulating layer 11 may be a buried oxide (BOX) layer, for example, including silicon dioxide, silicon nitride, or any other suitable material. A thin BOX layer 11 with a thickness in the range of 10-30 nm may be formed on the substrate 10.

A semiconductor layer 12 is formed on the BOX layer 11. The semiconductor layer 12 may be comprised of any appropriate semiconductor material, such as silicon, silicon/germanium, silicon/carbon, other II-VI or III-V semiconductor components and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. In the following it is assumed that the semiconductor layer 12 comprises silicon. The semiconductor layer 12 formed on the BOX layer 11 may have a thickness in the range of 5-30 nm, for example, 10-20 nm.

Figure 2B:
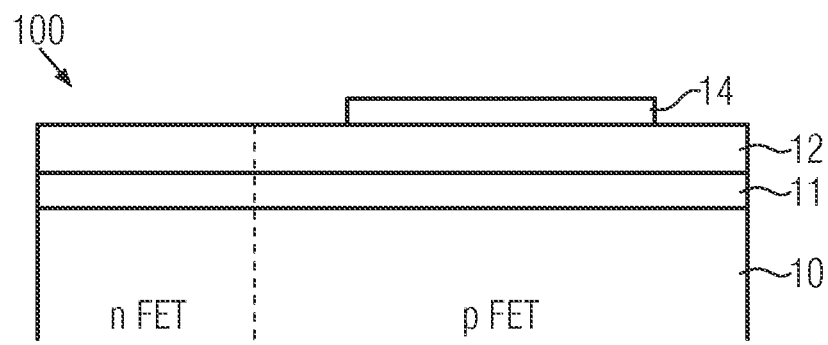

An area where NFET devices are to be formed and an area where PFET devices are to be formed may be defined (left and right of the dashed line shown in FIG. 2b, respectively). A mask layer 13, for example, an oxide hard mask, is formed on the semiconductor layer 12 over the PFET area and it is patterned by standard lithography techniques. It is noted that an oxide layer that may be formed (for example, by naturally occurring thermal oxidation) on the semiconductor layer 12 may be removed in the region exposed by the opening of the patterned mask layer 13. The patterned mask layer 13 is used for selectively forming an SiGe layer 14 and, after formation of the SiGe layer 14, the patterned mask layer 13 is removed, as shown in FIG. 2b. The SiGe layer 14 may be epitaxially grown on the exposed surface of the semiconductor layer 12. Thus far the processing is similar to the known technique of the art. Whereas here and in the following examples only one opening of the patterned mask layer 13 is shown, the patterned mask layer 13 may comprise a plurality of openings and the procedures described below may be carried out for each of the plurality of openings.

Figure 2C:
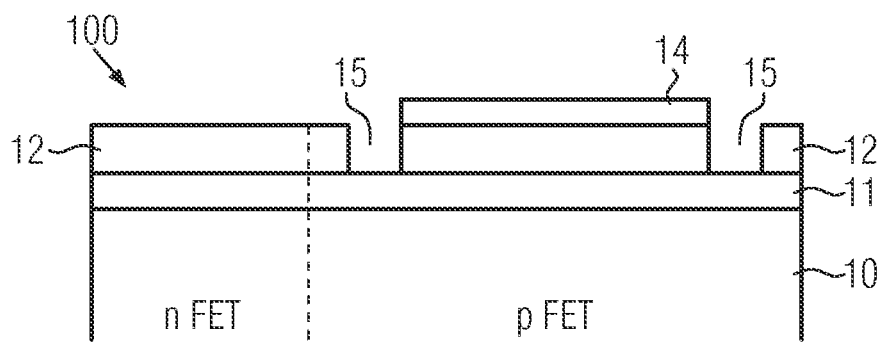
Figure 2D:
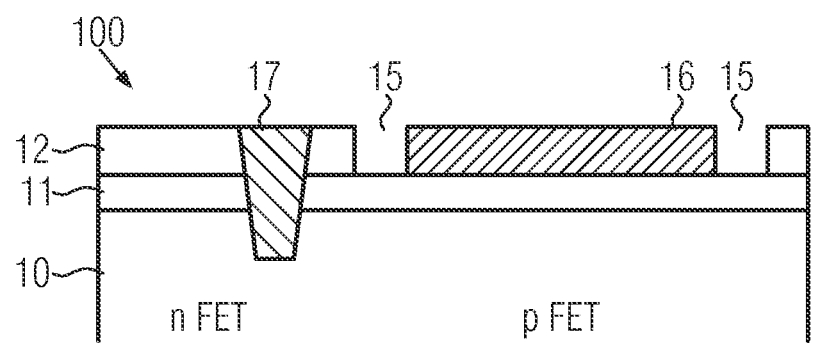

However, according to the exemplary inventive method of forming a semiconductor device 100 in the manufacturing stage illustrated in FIG. 2c, the thin semiconductor layer 12 is cut. The semiconductor layer 12 may be etched adjacent to the edges of the epitaxially formed SiGe layer 14, thereby forming openings 15 in the semiconductor layer 12.

After cutting the thin semiconductor layer 12, an anneal treatment is performed, for example, at a temperature of above 1000° C. or above 1200° C. The anneal results in a high-temperature oxidation process that oxidizes the silicon in the SiGe layer 14 shown in FIGS. 2b and 2c and pushes the germanium of this layer into the underlying portion of the semiconductor layer 12. During the anneal process, the semiconductor layer 12 over the NFET area is protected by another hard mask, for example, an SiN mask. In the manufacturing stage of the semiconductor device 100 illustrated in FIG. 2d, a single SiGe layer 16 is formed of the portion of the semiconductor layer 12 below the SiGe layer 14 shown in FIGS. 2b and 2c by the anneal treatment. The resulting silicon oxide layer above the formed single SiGe layer 16 may be removed. The single SiGe layer 16 may have a thickness of some 10 nm, for example, from about 8-12 nm.

Contrary to the art, no significant warping of the developing single SiGe layer 16 during the oxide enhanced condensation is observed thanks to the cut semiconductor layer 12 comprising the openings 15 that, in particular, separate a portion of the semiconductor layer 12 in an area where NFET devices are formed from a portion of the semiconductor layer 12 in an area where PFET devices are formed. Consequently, the different lattice constants of the portions of the semiconductor layer 12 of the NFET and PFET areas do not lead to any warping of the single SiGe layer 16 obtained by the oxide enhanced condensation. Advantageously, the cut semiconductor layer 12 allows for arbitrary germanium concentration of the single SiGe layer 16 without the risk of warping. For example the single SiGe layer 16 may comprise about 20-30% germanium or it even comprises more than 30% germanium.

After formation of the single SiGe layer 16, an isolation structure 17, for example, a shallow trench isolation (STI), is formed to separate the region where the P-channel transistor comprising the single SiGe layer 16 is formed from other regions, for example, a region where an N-channel transistor is formed. The isolation structure 17 may, in principle, be formed at some distance to an opening 15 or may be formed adjacent to the opening 15 or may be formed to overlap it.

Figure 2E:
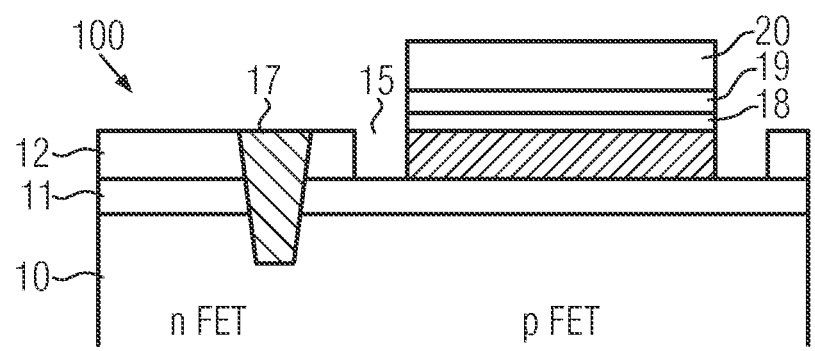

The thus obtained single SiGe layer 16 may provide the channels of PFETs. Accordingly, a gate dielectric layer 18 may be formed on the single SiGe layer 16, as shown in FIG. 2e. The gate dielectric layer 18 may be formed of a dielectric material having a greater dielectric constant than silicon dioxide, for example, a dielectric constant greater than four.

The gate dielectric layer 18 may include hafnium silicon oxynitride (HfSiON) and/or hafnium dioxide (HfO$_2$).

In the example of manufacturing a semiconductor device 100 shown in FIG. 2e, a metal gate layer 19 is formed on or over the gate dielectric layer 18. The metal gate layer 19 may comprise a plurality of layers that may include Al. AlN or TiN. In particular, the met gate layer 19 may comprise a work function adjusting material that comprises an appropriate transition metal nitride, for example, those from Groups 4-6 in the Periodic Table, including, for example, titanium nitride (TIN), tantalum nitride (TaN), titanium aluminum nitride (TiAlN), tantalum aluminum nitride (TaAlN), niobium nitride (NbN), vanadium nitride (VN), tungsten nitride (WN), and the like with a thickness of about 1-60 nm. A polysilicon layer 20 for forming a poly gate may be formed on the metal gate layer 19, as shown in FIG. 2e. Similar layers for forming gate electrode structure may be formed on the portion of the semiconductor layer 12 of the NFET area (not shown in FIG. 2e).

After appropriate etching of the stack of layers 18 to 20, a gate electrode structure is obtained. A sidewall spacer adjacent to the gate electrode comprising the metal gate and poly gate may be formed. A liner layer may be provided between the gate electrode and the sidewall spacer. The sidewall spacer may include silicon dioxide, and the liner layer may include silicon nitride or vice versa. Further, source and drain regions for the PFET device may be formed. The source and drain regions may include silicon and appropriately selected dopants and may be provided in the form of raised source and drain regions. The raised source and drain regions may be at least partially formed in the openings 15.

Another example of a method of forming a semiconductor device comprising a PFET with an SiGe channel is illustrated in FIGS. 3a-3f. In the manufacturing stage shown in FIG. 3a, a semiconductor device 200 comprises a semiconductor layer 202 formed on a BOX layer 201 of an SOI wafer. The portion of the wafer shown in FIG. 3a may be neighbored by a portion on which NFET devices are formed (compare FIG. 2a). Similar to the example shown in FIG. 2a, the BOX layer 201 may have a thickness in the range of 10-30 nm and, for example, may include silicon dioxide, silicon nitride or at any other suitable material. The semiconductor layer 202 may be comprised of any appropriate semiconductor material, such as silicon, silicon/germanium, silicon/carbon, other II-VI or III-V semiconductor components and the like and may have a thickness in the range of 5-30 nm, for example, 10-20 nm. In the following it is assumed that the semiconductor layer 202 comprises silicon.

Figure 3A:
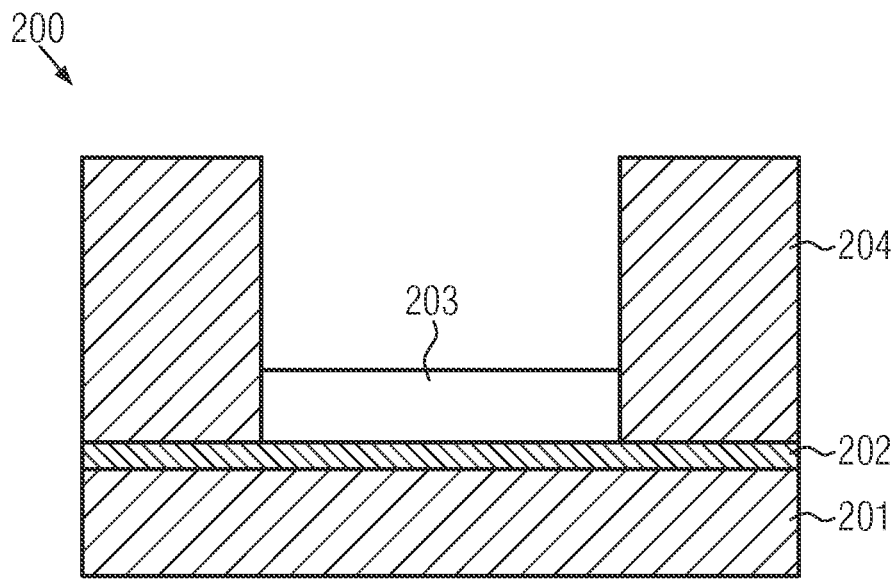
FIGS. 3a-3f illustrate the manufacturing of a semiconductor device comprising a PFET with cSiGe according to an example of the present invention comprising the formation of an amorphous silicon layer.
Figure 3B:
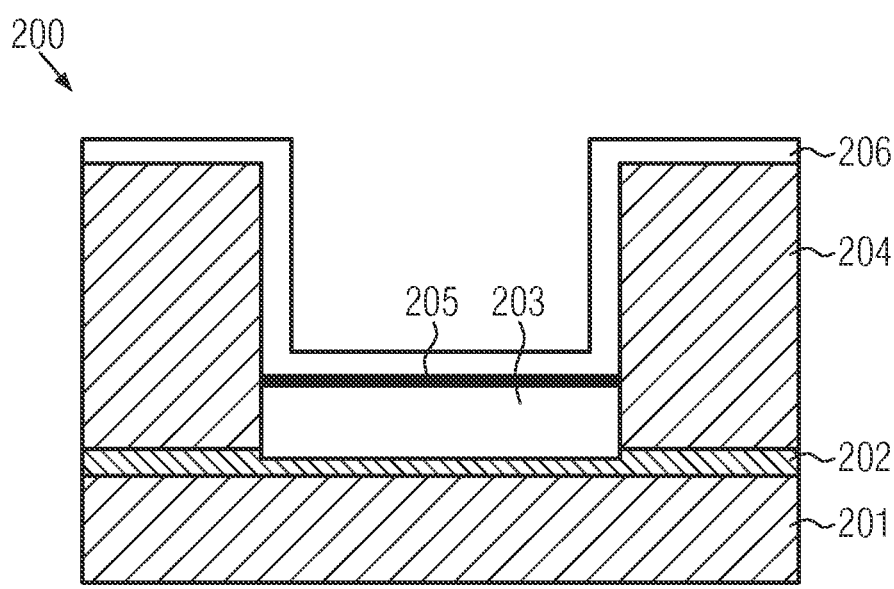

An SiGe layer 203 is formed, for example, by (selective) epitaxy, over the semiconductor layer 202 by means of a patterned oxide mask layer 204. Partial oxidation of the SiGe layer 203 may convert an upper portion of the same into an oxide layer. In any case, a barrier layer 205 is formed on top of the SiGe layer 203, as shown in FIG. 3b. The barrier layer 205 may be formed by nitridation, for example. An undoped amorphous silicon layer 206 is formed on the barrier layer 205 and upper surfaces and sidewalls of the mask layer 204 (see FIG. 3b). The thickness of the amorphous silicon layer 206 may be in a range of 10-20 nm.

Figure 3C:
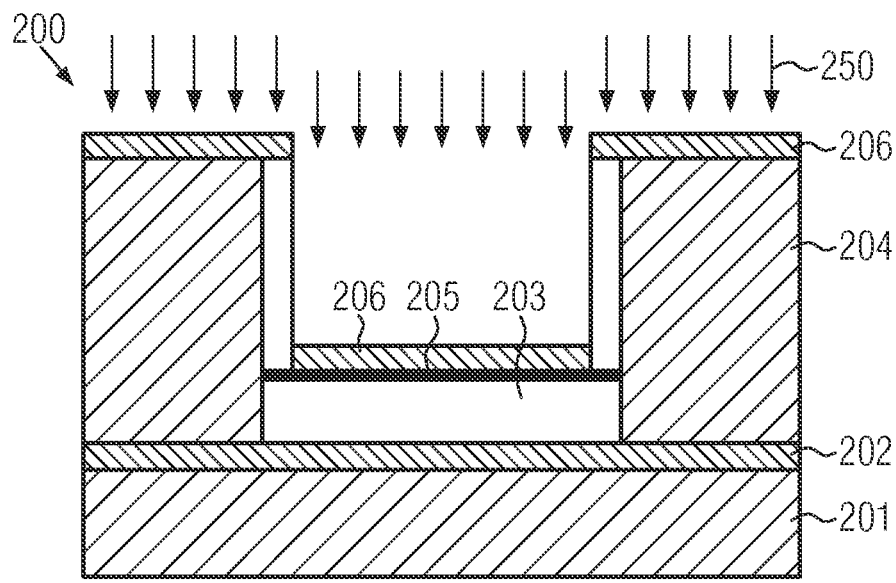
Figure 3D:
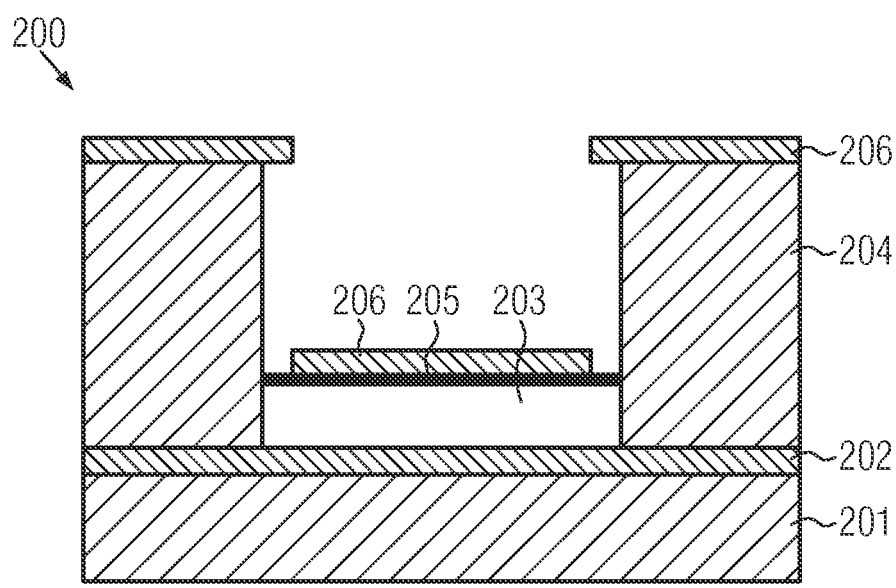

An implantation process 250 with a zero tilt angle (measured from an axis perpendicular to the surface of the SiGe layer 203 or semiconductor layer 202) is performed, as illustrated in FIG. 3c. The implantation process 250 might be carried out with BF$_2$ implants with an implantation energy of some 10 kV and an implantation dose of some $10^{14}$ cm$^{-2}$, for example. Due to the 0° tilt angle implantation, only horizontal regions of the amorphous silicon layer 206 get doped. The vertical regions that remain undoped may be removed, for example, by selective wet etching (see FIG. 3d). The wet etching may be carried out by means of ammonia or TMAH. The barrier layer 205 protects the underlying layers during the etching process.

Figure 3E:
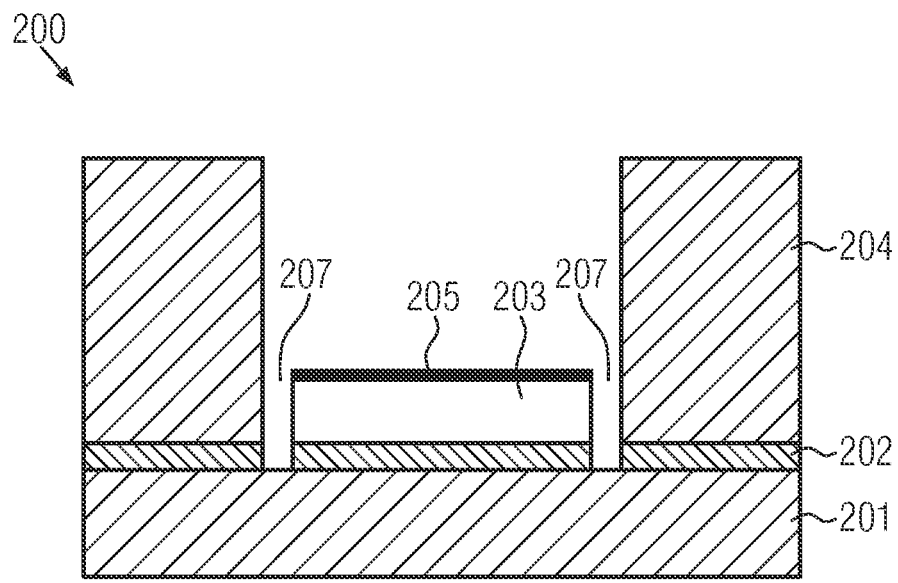
Figure 3F:
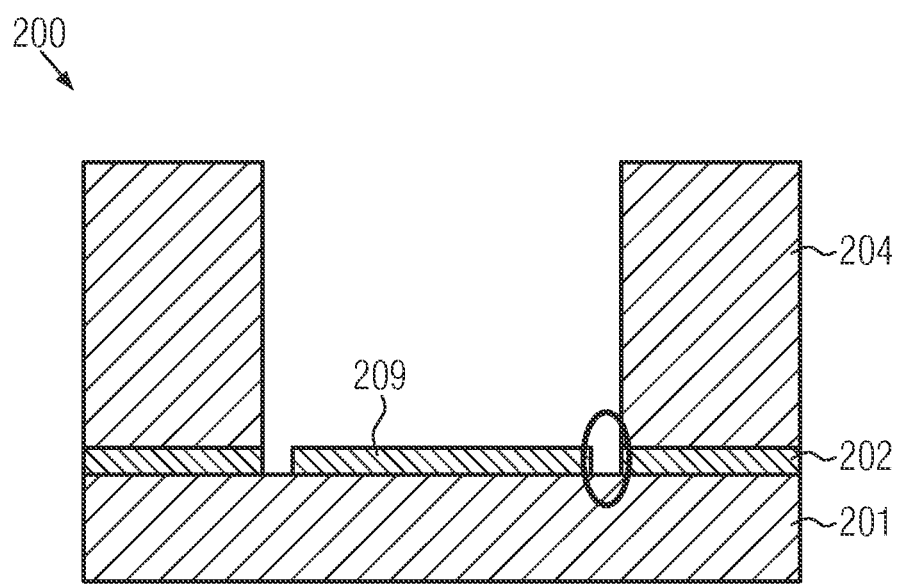

In the manufacturing step of the semiconductor device 200 shown in FIG. 3e, the barrier layer 205 is opened and the SiGe layer 203 and the semiconductor layer 202 are cut and openings 207 are consequently formed adjacent to edges of the mask layer 204. By cutting the semiconductor layer 202, a portion of the same underlying the SiGe layer 203 is separated from other portions, in particular, portions provided for the formation of NFET devices (compare FIGS. 2c to 2e). The barrier layer 205 may be removed, for example, by wet etching, as illustrated in FIG. 3f.

The transition area indicated by the oval contour in FIG. 3f may be cut in order to form an STI in a later processing step. Thermal anneal may be performed resulting in oxide enhanced condensation in order to convert the bilayer comprising the SiGe layer 203 and the underlying portion of the semiconductor layer 202 into a single SiGe layer 209 as described above with reference to FIG. 2d. The single SiGe layer 209 may comprise about 20-30% germanium or it even comprises more than 30% germanium. Again, no significant warping of the developing single SiGe layer during the oxide enhanced condensation is observed thanks to the cut semiconductor layer 202 comprising the openings 207 that, in particular, separate a portion of the semiconductor layer 202 in an area where NFET devices are formed from a portion of the semiconductor layer 202 in an area where PFET devices are formed. Gate electrodes and source and drain regions may be formed as described above.

Figure 4A:
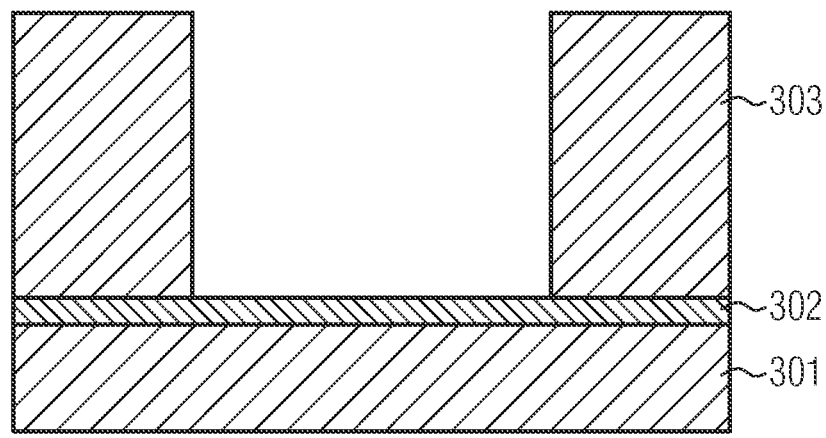
FIGS. 4a-4i illustrate the manufacturing of a semiconductor device comprising a PFET with cSiGe according to an example of the present invention comprising the formation of a spacer layer.
Figure 4B:
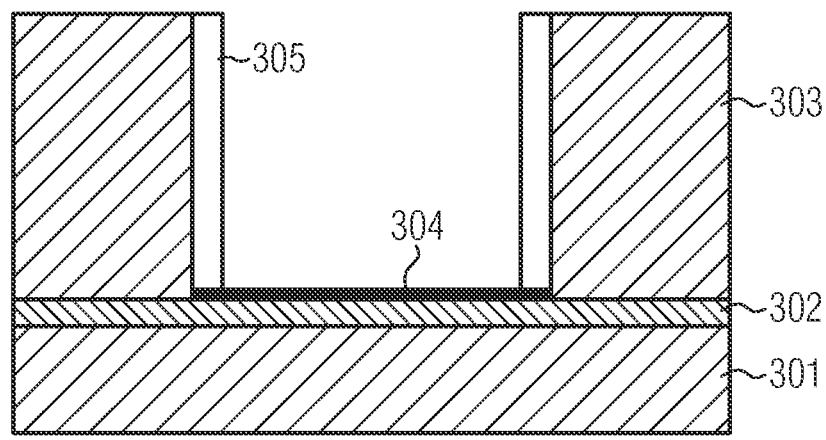

Another example of a method of forming a semiconductor device comprising a PFET with an SiGe channel is illustrated in FIGS. 4a-4i. An SOI wafer comprising a BOX layer 301 and a semiconductor layer 302 formed on the BOX layer 301 is provided. The portion of the wafer shown in FIG. 4a may be neighbored by a portion on which NFET devices are formed (compare FIG. 2a). Similar to the example shown in FIG. 2a, the BOX layer 301 may have a thickness in the range of 10-30 nm and, for example, may include silicon dioxide, silicon nitride, or any other suitable material. The semiconductor layer 302 may be comprised of any appropriate semiconductor material, such as silicon, silicon/germanium, silicon/carbon, other II-VI or III-V semiconductor components and the like and may have a thickness in the range of 5-30 nm, for example, 10-20 nm. In the following, it is assumed that the semiconductor layer 302 comprises silicon. A patterned mask layer 303 is formed on the semiconductor layer 302, as illustrated in FIG. 4a.

An oxide barrier layer 304 is formed on the exposed portion of the semiconductor layer 302. The oxide barrier layer 304 is provided to protect the semiconductor layer 302 during the process of forming a spacer layer 305 at sidewalls of the patterned mask layer 303 (see FIG. 4b). The oxide barrier layer 304 may, alternatively, be formed on the semiconductor layer 302 before formation of the patterned mask layer 303. The spacer layer 305 may have a thickness in the range of 10-20 nm and it may comprise or be made of SiN.

Figure 4C:
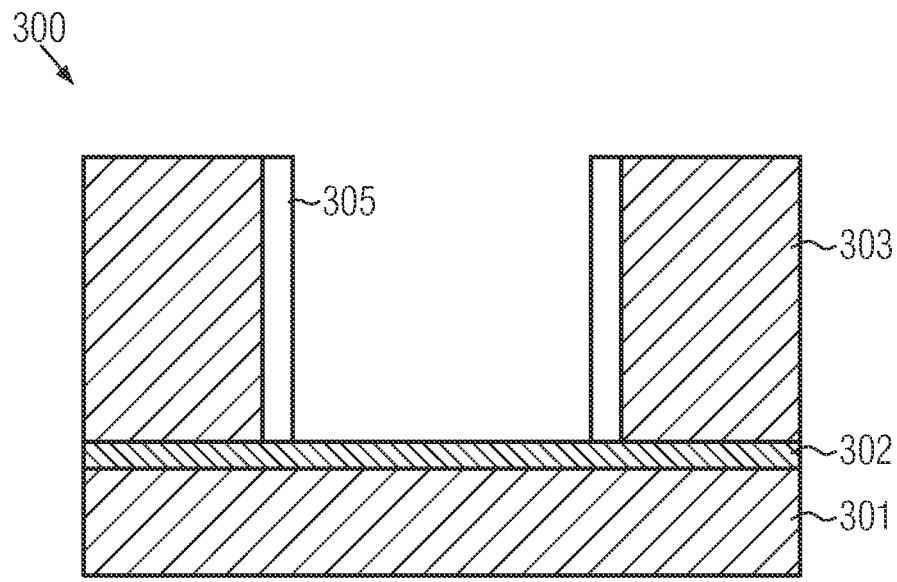
Figure 4D:
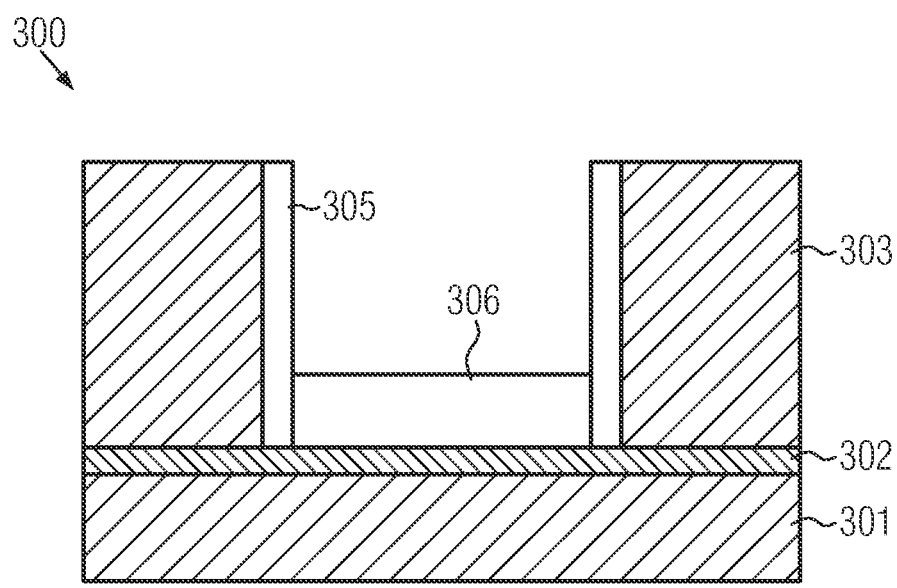
Figure 4E:
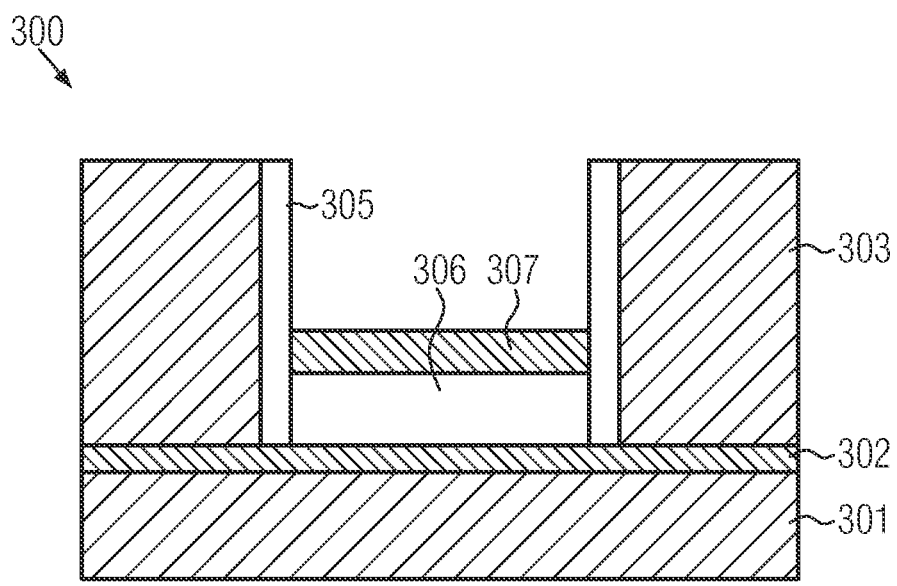

After formation of the spacer layer 305, the oxide barrier layer 304 is removed, for example, by wet etching (see FIG. 4c). The wet etching may be performed by means of a dilute HF solution. As illustrated in FIG. 4d, an SiGe layer 306 is formed, for example, by epitaxy, on the exposed surface of the semiconductor layer 302. Partial oxidation of the SiGe layer 306 results in conversion of an upper portion of the same into an oxide layer 307, as shown in FIG. 4e.

Figure 4F:
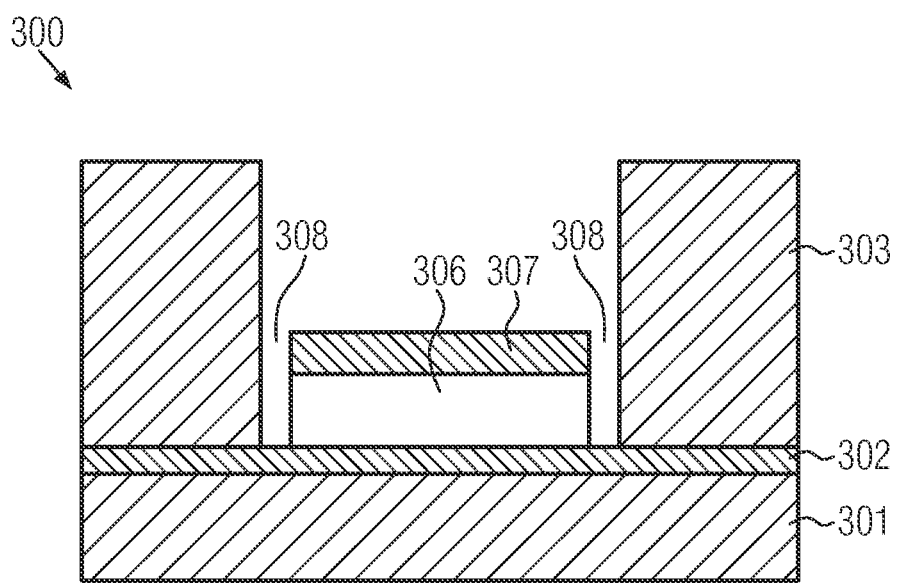
Figure 4G:
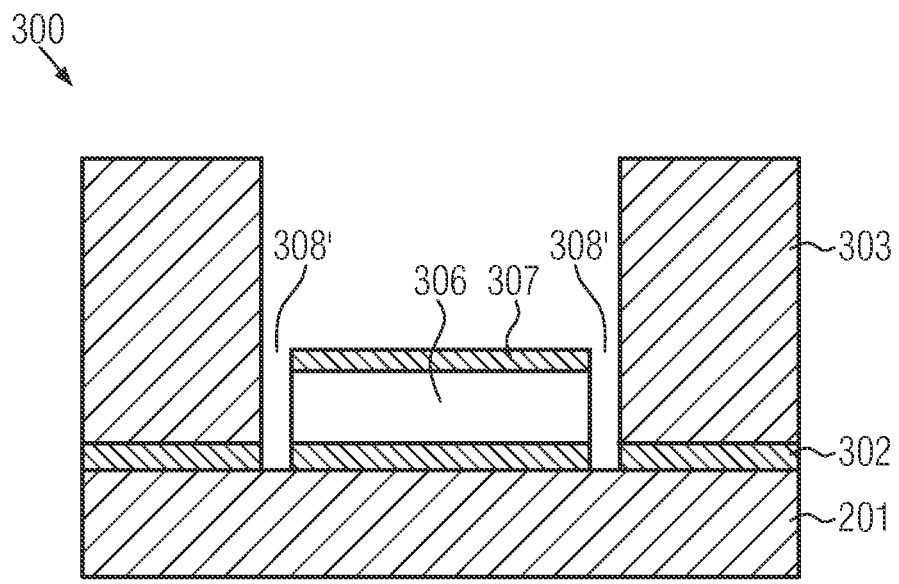
Figure 4H:
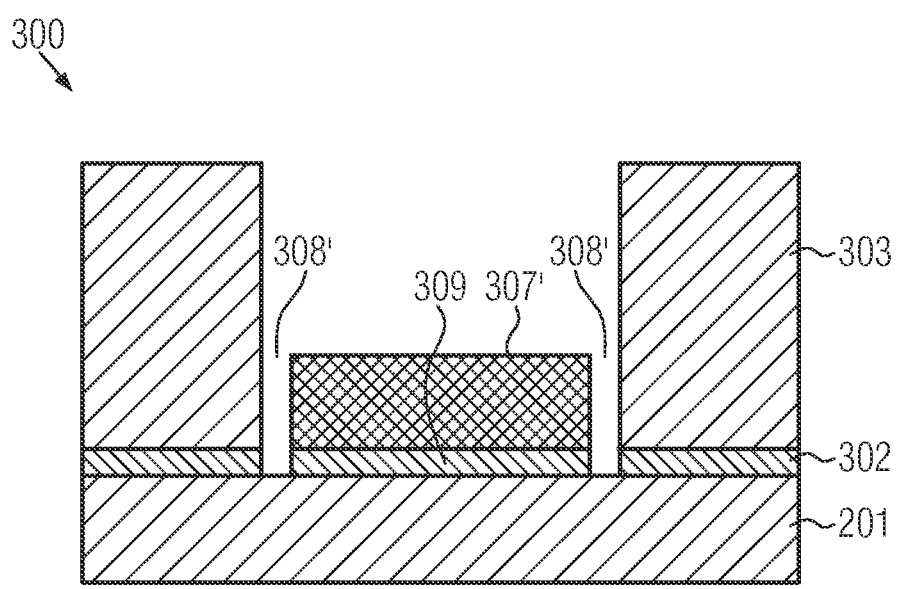

In the manufacturing stage shown in FIG. 4f, the spacer layer 305 is removed from the semiconductor device 300. Removal of the spacer layer 305 may be achieved by wet etching, hot phosphorous etching, for example. Removal of the spacer layer 305 results in the formation of openings 308 between the edges of the mask layer 303 and the stack comprising the SiGe layer 306 and the oxide layer 307. In the manufacturing stage of the semiconductor device 300 shown in FIG. 4g, the semiconductor layer 302 is cut, thereby forming deepened openings 308' adjacent to edges of the mask layer 303. By cutting the semiconductor layer 302, a portion of the same underlying the stack comprising the SiGe layer 306 and the oxide layer 307 is separated from other portions of the semiconductor layer 302, in particular, portions provided for the formation of NFET devices (compare FIGS. 2c to 2e).

Thermal anneal may be performed resulting in oxide enhanced condensation in order to convert the bilayer comprising the SiGe layer 306 and the underlying portion of the semiconductor layer 302 into a single SiGe layer, as described above with reference to FIG. 2d. The single SiGe layer 309 (see FIG. 4h) may comprise about 20-30% germanium or it even comprises more than 30% germanium. A thickened oxide layer 307' is thereby formed atop of the formed single SiGe layer 309. Again, no significant warping of the developing single SiGe layer 309 during the oxide enhanced condensation is observed thanks to the cut semiconductor layer 302 comprising the openings 308' that, in particular, separate a portion of the semiconductor layer 302 in an area where NFET devices are formed from a portion of the semiconductor layer 302 in an area where PFET devices are formed. Gate electrodes and source and drain regions may be formed as described above.

Figure 4I:
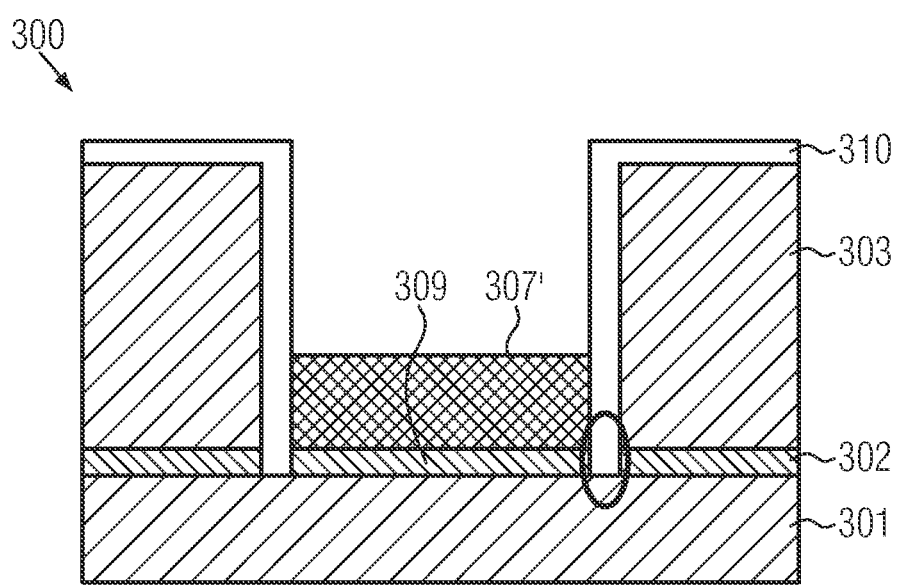

Furthermore, as illustrated in FIG. 4i, an oxide liner 310 may be formed in the openings 308', on the upper surface of the thickened oxide layer 307' and on side walls and the top surface of the mask layer 303. The transition area for a subsequently formed STI is indicated in FIG. 4i by the oval contour. The oxide liner 310 may be provided to seal the previously cut areas, particularly the BOX layer 302 that is partly exposed in the openings 308' shown in FIG. 4h. By sealing with the oxide liner 310, the partly exposed BOX layer 302 may be protected against etching steps subsequently performed in order to remove the thickened oxide layer 307', for example.

As a result, a semiconductor device and a method of forming a semiconductor device is provided comprising PFET with cSiGe that are superior to the art with respect to the accurate adjustment of the threshold voltages and carrier mobility due to the fact that warping of the SiGe channels of the PFETs may be effectively avoided.

Whereas, in the above-described embodiments, an SiGe comprising channel is formed from a semiconductor layer comprising silicon and another semiconductor layer comprising SiGe that is formed on the semiconductor layer, in principle, the invention may be applied to any semiconductor layer comprising a first material component and any other semiconductor layer comprising the first material component and a second material component that is different from the first material component and diffuses into the semiconductor layer during a thermal anneal/oxidation enhanced condensation process. It has only to be observed that the strained material of the resulting channel layer after the thermal anneal/oxidation enhanced condensation process is appropriate for PFET devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
   providing a semiconductor-on-insulator (SOI) wafer comprising a first semiconductor layer comprising a first material component and formed on a buried oxide (BOX) layer; and
   forming a channel region of a P-channel transistor device, wherein forming said channel region comprises:
      forming a second semiconductor layer only over a first portion of said first semiconductor layer, wherein said second semiconductor layer comprises said first material component and a second material component different from said first material component;
      forming an opening in said first semiconductor layer outside said first portion, said opening exposing said buried oxide layer; and
      performing a thermal anneal to push said second material component from said second semiconductor layer into said first semiconductor layer while said opening exposes said buried oxide layer.

2. The method of claim 1, further comprising:
   forming a P-channel FET in and on said first portion of said first semiconductor layer; and
   forming an N-channel FET in and on a second portion of said first semiconductor layer that is separated from said first portion by said opening.

3. The method of claim 2, further comprising forming, after performing said thermal anneal, an isolator region in said first semiconductor layer and said BOX layer to electrically separate said P-channel transistor device from said N-channel transistor device.

4. The method of claim 1, wherein said thermal anneal results in an oxide enhanced condensation of said second semiconductor layer into said first semiconductor layer.

5. The method of claim 1, wherein said first material component comprises silicon and said second material component comprises SiGe.

6. The method of claim 1, wherein forming said second semiconductor layer only over said first portion of said first semiconductor layer comprises:
   forming a patterned mask layer comprising a mask layer opening over said first semiconductor layer; and
   forming said second semiconductor layer in said mask layer opening;
   wherein said opening in said first semiconductor layer is formed at an edge of said mask layer opening.

7. The method of claim 6, further comprising:
   forming a liner over said second semiconductor layer;
   performing an implantation of said liner with a tilt angle of substantially zero to obtain doped and undoped regions of said liner; and
   removing said undoped regions of said liner;

wherein said forming of said opening in said first semiconductor layer outside said first portion is performed in the presence of said doped regions of said liner.

8. The method of claim 6, further comprising:
forming an amorphous silicon layer over said second semiconductor layer;
performing an implantation of said amorphous silicon layer with a tilt angle of substantially zero to obtain doped and undoped regions of said amorphous silicon layer; and
removing said undoped regions of said amorphous silicon layer;
wherein said forming of said opening in said first semiconductor layer outside said first portion is performed in the presence of said doped regions of said amorphous silicon layer.

9. The method of claim 1, wherein forming said second semiconductor layer only over said first portion of said first semiconductor layer comprises:
forming a patterned mask layer comprising a mask layer opening over said first semiconductor layer;
forming a spacer layer at edges of said mask layer opening, thereby forming a reduced mask layer opening;
forming said second semiconductor layer in said reduced mask layer opening; and
subsequently removing said spacer layer, thereby forming an opening between an edge of said patterned mask layer and an edge of said formed second semiconductor layer;
wherein said opening in said first semiconductor layer is formed through said opening formed between said edge of said patterned mask layer and said edge of said formed second semiconductor layer.

10. The method of claim 9, further comprising filling said opening formed in said first semiconductor layer by an oxide material.

11. A method of forming a semiconductor device, the method comprising:
forming an N-channel transistor device on a first region of a silicon-on-insulator (SOI) wafer that comprises a buried oxide (BOX) layer on a substrate and a first semiconductor layer comprising a first material component on said BOX layer;
forming a P-channel transistor device on a second region of said SOI wafer that is different from said first region;
wherein forming said P-channel transistor device comprises:
forming a second semiconductor layer comprising said first material component and a second material component different from said first material component on said first semiconductor layer in said second region without forming it in said first region;
forming an opening in said first semiconductor layer adjacent to said second semiconductor layer, said opening exposing said buried oxide layer; and
performing a thermal anneal to push said second material component of said second semiconductor layer into said first semiconductor layer while said opening exposes said buried oxide layer.

12. The method of claim 11, further comprising forming an isolation region separating said first region from said second region after performing said thermal anneal.

13. The method of claim 11, wherein said thermal anneal results in an oxide enhanced condensation of said second semiconductor layer into said first semiconductor layer.

14. The method of claim 11, wherein said first material component comprises silicon and said second material component comprises SiGe.

15. The method of claim 11, further comprising:
forming a patterned mask layer comprising a mask layer opening over said first semiconductor layer;
wherein said second semiconductor layer is formed in said mask layer opening;
and further comprising:
forming a liner over said second semiconductor layer;
performing an implantation of said liner with a tilt angle of substantially zero to obtain doped and undoped regions of said liner; and
removing said undoped regions of said liner;
wherein said forming of said opening in said first semiconductor layer is performed in the presence of said doped regions of said liner.

16. The method of claim 11, further comprising:
forming a patterned mask layer comprising a mask layer opening over said first semiconductor layer;
wherein said second semiconductor layer is formed in said mask layer opening;
and further comprising:
forming an amorphous silicon layer over said second semiconductor layer;
performing an implantation of said amorphous silicon layer with a tilt angle of substantially zero to obtain doped and undoped regions of said amorphous silicon layer; and
removing said undoped regions of said amorphous silicon layer;
wherein said forming of said opening in said first semiconductor layer is performed in the presence of said doped regions of said amorphous silicon layer.

17. The method of claim 11, further comprising:
forming a patterned mask layer comprising a mask layer opening over said first semiconductor layer;
forming a spacer layer at edges of said mask layer opening, thereby forming a reduced mask layer opening;
forming said second semiconductor layer in said reduced mask layer opening; and
subsequently removing said spacer layer, thereby forming an opening between an edge of said patterned mask layer and an edge of said formed second semiconductor layer;
wherein said opening in said first semiconductor layer is formed through said opening formed between said edge of said patterned mask layer and said edge of said formed second semiconductor layer.

18. A method of forming a semiconductor device, the method comprising:
providing a semiconductor-on-insulator (SOI) wafer comprising a first semiconductor layer comprising a first material component and formed on a buried oxide (BOX) layer; and
forming a channel region of a P-channel transistor device, wherein forming said channel region comprises:
forming a second semiconductor layer only over a first portion of said first semiconductor layer, said second semiconductor layer comprising said first material component and a second material component different from said first material component, wherein forming said second semiconductor layer comprises:
forming a patterned mask layer comprising a mask layer opening over said first semiconductor layer;

forming a spacer layer at edges of said mask layer opening, thereby forming a reduced mask layer opening;
   forming said second semiconductor layer in said reduced mask layer opening; and
   subsequently removing said spacer layer, thereby forming an opening between an edge of said patterned mask layer and an edge of said formed second semiconductor layer;
forming an opening in said first semiconductor layer outside said first portion, wherein said opening in said first semiconductor layer is formed through said opening formed between said edge of said patterned mask layer and said edge of said formed second semiconductor layer; and
   subsequently performing a thermal anneal to push said second material component from said second semiconductor layer into said first semiconductor layer.

19. The method of claim 18, further comprising, after performing said thermal anneal, forming an isolation region at least partially in said opening formed in said first semiconductor layer.

* * * * *